US008917125B1

(12) United States Patent
Waltari

(10) Patent No.: US 8,917,125 B1
(45) Date of Patent: Dec. 23, 2014

(54) INTERLEAVING ANALOG-TO-DIGITAL CONVERTER (ADC) WITH BACKGROUND CALIBRATION

(71) Applicant: IQ-Analog Corporation, San Diego, CA (US)

(72) Inventor: Mikko Waltari, Escondido, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 14/511,206

(22) Filed: Oct. 10, 2014

Related U.S. Application Data

(63) Continuation-in-part of application No. 14/081,568, filed on Nov. 15, 2013, now Pat. No. 8,878,577, which is a continuation-in-part of application No. 13/603,495, filed on Sep. 5, 2012, now Pat. No. 8,654,000.

(51) Int. Cl.
*H03L 7/06* (2006.01)
*H03M 1/06* (2006.01)
*H03M 1/12* (2006.01)

(52) U.S. Cl.
CPC ............ *H03M 1/0626* (2013.01); *H03M 1/124* (2013.01)
USPC ............ 327/147; 327/150; 327/149; 327/156

(58) Field of Classification Search
USPC .............. 327/141, 144–163; 331/1/A, 15–17; 375/373–376
See application file for complete search history.

(56) References Cited

U.S. PATENT DOCUMENTS 5,867,542 A * 2/1999 Iwamatsu et al. ............. 375/354

| | | | |
|---|---|---|---|
| 6,873,281 B1 * | 3/2005 | Esterberg et al. ............. | 341/163 |
| 7,250,885 B1 * | 7/2007 | Nairn ............................ | 341/141 |
| 7,253,762 B2 | 8/2007 | Huang et al. | |
| 7,301,486 B2 * | 11/2007 | Wang et al. ................... | 341/118 |
| 7,843,373 B2 * | 11/2010 | Carreau ........................ | 341/155 |

(Continued)

FOREIGN PATENT DOCUMENTS

CN 102291141 3/2014

OTHER PUBLICATIONS

Mark Looney, "Advanced Digital Post-Processing Techniues Enhance Performance in Time-Interleaved ADC SYstems", Analog Devices library, vol. 37—Aug. 2003.

(Continued)

*Primary Examiner* — Brandon S Cole
(74) *Attorney, Agent, or Firm* — Law Office of Gerald Maliszewski; Gerald Maliszewski

(57) ABSTRACT

A system and method are provided of performing background corrections for an interleaving analog-to-digital converter (ADC). An analog input signal $s1(t)$ is accepted having a first frequency f1 and a bandwidth (BW). The method generates a clock at frequency fs, and creates 2 sample clocks with evenly spaced phases, each having a sample clock frequency of fs/2. The method also generates a first tone signal $s2(t)$ having a predetermined second frequency f2 outside BW. The analog input signal and the first tone signal are combined, creating a combination signal, which is sampled using the sample clocks, creating 2 digital sample signals per clock period 1/fs. The 2 digital sample signals are interleaved, creating an interleaved signal. Corrections are applied that minimize errors in the interleaved signal, to obtain a corrected digital output. Errors are determined at an alias frequency f3, associated with the second frequency f2, to obtain correction information.

20 Claims, 12 Drawing Sheets

(56) References Cited

U.S. PATENT DOCUMENTS

| | | |
|---|---|---|
| 7,932,845 B2 * | 4/2011 | Sheng et al. .................. 341/120 |
| 8,542,142 B2 | 9/2013 | Stein et al. |
| 8,604,953 B2 | 12/2013 | Ali |
| 8,730,072 B2 * | 5/2014 | Petigny et al. ................ 341/120 |
| 2008/0048897 A1 | 2/2008 | Parthasarthy et al. |
| 2012/0075129 A1 | 3/2012 | Kidambi |
| 2013/0106632 A1 | 5/2013 | Petigny et al. |
| 2014/0015703 A1 | 1/2014 | Pullela et al. |

OTHER PUBLICATIONS

Razavi et al., "Problem of Timing Mismatch in Interleaved ADCs", 978-1-4673-1556-2/121$31.00@2012 IEEE.

Vogel et al., "Adaptive Blind COmpensation of Gain and Timing Mismatches in M-Channel Time-Interleaved ADCs", 978-1-4244-2182-4/08/$25.00, 2008 IEEE.

* cited by examiner

INTERLEAVING ANALOG-TO-DIGITAL CONVERTER (ADC) WITH BACKGROUND CALIBRATION

RELATED APPLICATIONS

This application is a Continuation-in-part of an application entitled, SYSTEM AND METHOD FOR FREQUENCY MULTIPLIER JITTER CORRECTION, invented by Mikko Waltari et al., Ser. No. 14/081,568, filed Nov. 15, 2013;

which is a Continuation-in-Part of an application entitled, TIME-INTERLEAVED ANALOG-TO-DIGITAL CONVERTER FOR SIGNALS IN ANY NYQUIST ZONE, invented by Mikko Waltari, Ser. No. 13/603,495, filed Sep. 5, 2012, issued as U.S. Pat. No. 8,654,000 on Feb. 18, 2014. Both these application are incorporated herein by reference.

BACKGROUND OF THE INVENTION

1. Field of the Invention

This invention generally relates to analog-to-digital converters (ADCs) and, more particularly, to a system and method for correcting errors in an interleaved ADC.

2. Description of the Related Art

An N-path time interleaved ADC consists of N component ADCs operated in parallel, which together sample the signal N times at the rate of the individual ADC components. In practice, the component ADCs are never truly identical, and the sampling clocks they receive can have small phase deviations from the ideal sampling phase. As a result, these timing and gain errors produce artifacts that in frequency domain show up as spectral images of the desired signal centered around every multiple of fs/N, where fs is the sampling rate of the composite ADC. If the errors are known they can be corrected with either digital post-processing after the ADC, or with an analog correction circuitry in the ADC, or with some combination of the two. However, without knowing the ADC input signal, error detection is difficult.

One way to facilitate the error detection task is to inject a narrow band known test signal into the ADC input. One prior art solution uses a high pass filter that removes most of the other signal content preserving the spectral image of the test tone, based on the assumption that the spectrum around the tone is relatively clean from noise and other signals. This is not necessarily the case in a real world application. For instance, if the tone to be detected is near fs/2 of the ADC bandwidth, this region of spectrum typically falls in the transition band of the anti-alias filter that is often used in front of the ADC, and it can have partially attenuated spectra of neighboring signal channels or other unwanted signals. The accuracy of the tone detection is limited by this additional signal content in the pass band of the filter. The filter is also fairly costly to implement due to its relatively narrow bandwidth.

U.S. Pat. No. 7,932,845 describes an error detection method that performs a fast Fourier transform (FFT) on individual ADC outputs before they are interleaved. If a wideband input signal is introduced, the individual ADC outputs have aliased signal spectra that can "hide" a small test tone being introduced for the purpose of detection and correction. As a result, this method does not provide a useful means of correcting errors in the presence of an input signal, and does not provide true background calibration.

It would be advantageous if errors in an interleaving ADC could be accurately detected and minimized using a narrow-band background test tone in the presence of an input signal.

SUMMARY OF THE INVENTION

Disclosed herein are a system and method to identify the phase and amplitude of a test tone inserted in the input of a time-interleaved analog-to-digital converter (ADC), for the purpose of gain mismatch and timing skew calibration.

Accordingly, a method is provided of performing background corrections for an interleaving ADC. The method accepts an analog input signal s1($t$) having a first frequency f1 and a bandwidth (BW). The method generates a clock having a clock frequency fs, and creates 2 sample clocks with evenly spaced phases, each having a sample clock frequency of fs/2. The method also generates a first tone signal s2($t$) having a predetermined second frequency f2 outside BW. The analog input signal and the first tone signal are combined. This combination signal is sampled using the sample clocks, creating 2 digital sample signals per clock period 1/fs. The 2 digital sample signals are interleaved, creating an interleaved signal. Corrections are applied that minimize errors in the interleaved signal, to obtain a corrected digital output. Errors are determined at an alias frequency f3, associated with the second frequency f2, to obtain correction information.

In one aspect, a time-to-frequency conversion is performed at the second frequency f2, creating a S2($f$) signal in the frequency domain. Further, a time-to-frequency conversion is performed for an alias signal s3($t$), at frequency f3, creating a S3($f$) signal in the frequency domain. In response to comparing the S2($f$) signal to the S3($f$) signal, a first in-phase component magnitude and a second quadrature-phase component magnitude are obtained. As a result, the magnitude of the first component, the second component, or both the first and second components are minimized. Typically, the time-to-frequency conversion at frequencies f2 and f3 are performed using discrete Fourier transforms (DFTs), which may be a single bin DFT algorithm or a fast Fourier transform (FFT). The corrections that are applied include adjusting digital sample signal amplitudes, adjusting sample clock phases, adjusting the digital sample signal phases, or combinations or the above-mentioned adjustments.

Additional details of the above described method, variations of the method, and an associated system performing background corrections for an interleaving ADC are provided below.

DETAILED DESCRIPTION

Figure 1:
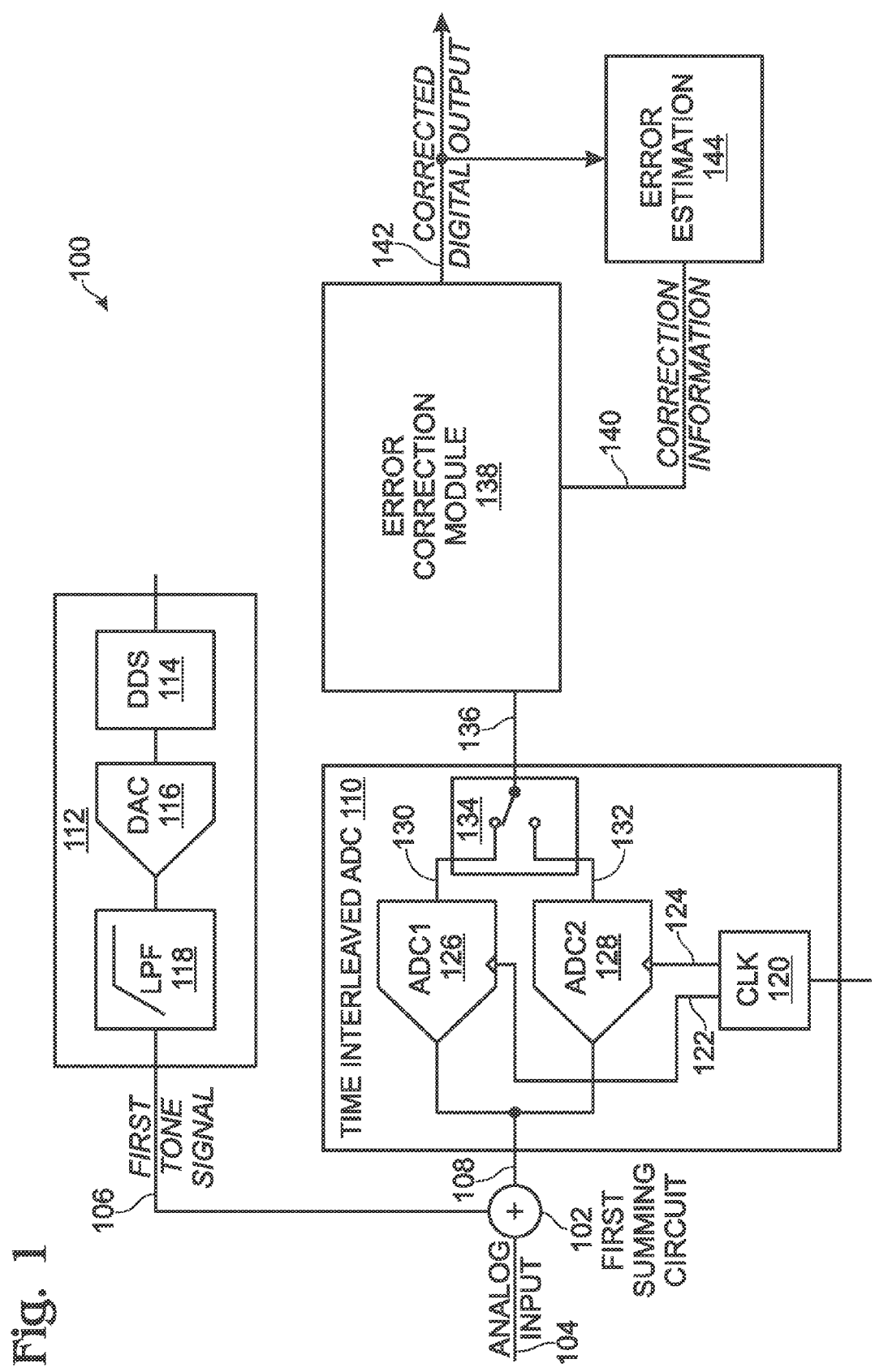
FIG. 1 is a schematic block diagram depicting a system performing background corrections for an interleaving analog-to-digital converter (ADC).

FIG. 1 is a schematic block diagram depicting a system performing background corrections for an interleaving analog-to-digital converter (ADC). The system 100 comprises a first summing circuit 102 having an input on line 104 to accept an analog input signal s1(t) with a first frequency f1 and a bandwidth (BW), and an input on line 106 to accept a first tone signal s2(t) having a predetermined second frequency f2 outside BW. The first summing circuit 102 has an output on line 108 to supply a combination signal to time interleaved ADC 110. The first test tone is supplied by signal or pilot tone generator 112. In one aspect, the signal generator 112 comprises a direct digital synthesizer (DDS) 114, digital-to-analog converter (DAC) 116, and lowpass filter 118. However, the system is not limited to any particular means of generating the first test signal.

Clock 120 has a clock frequency fs, with outputs on lines 122 and 124 to respectively supply 2 sample clocks with evenly spaced phases (i.e. 180 degrees apart), each having a sample clock frequency of fs/2. The interleaving ADC 110 comprises a first ADC 126 and a second ADC 128 having inputs to accept the combination signal on line 108 and the two sample clocks, respectively, on lines 122 and 124. The output of the first ADC 126 on line 130 is combined with the output of the second ADC on line 132, as represented by switch 134, and the switch supplies an interleaved signal on line 136.

As used herein, the terms s1(t) and s2(t) represent signals in time domain. For example, a function of t may be sin $(2*\pi*f1 \cdot t)$. In the term $F\{s(t)\}$, F is an operator for Fourier transform. S(f) is a signal in frequency domain. Using the explanations above, $S(f)=F\{s(t)\}$.

An error correction module 138 has an input on line 136 to accept the interleaved signal and an input on line 140 to accept correction information. The error correction module 138 applies corrections that minimize errors in the interleaved signal on line 136, and supplies a corrected digital output on line 142. As explained in more detail below, the error correction module 138 supplies correction information for adjusting digital sample signal amplitudes, adjusting the digital sample signal phases, or combinations or the above-mentioned adjustments. As shown in the example depicted in FIG. 4, correction information can also be supplied in the form of adjusting the sample clock phases (see timing vernier 400).

An error estimation module 144 has an input on line 142 to accept the corrected digital output. The error estimation module 144 determines errors at an alias frequency f3, associated with the second frequency f2, to supply the correction information at an output on line 140.

In one aspect, the error estimation module 144 performs a time-to-frequency conversion at the second frequency f2 and the third frequency f3, respectively creating S2(f) and S3(f) signals in the frequency domain. The error estimation module 144 compares the S2(f) signal to the S3(f) signal, and obtains a first in-phase component magnitude and a second quadrature-phase component magnitude. The error estimation module 144 supplies correction information to minimize the magnitude of the first component, the second component, or both the first and second components. Typically, the error estimation module 144 performs discrete Fourier transforms (DFTs) at frequencies f2 and f3.

Figure 2A:
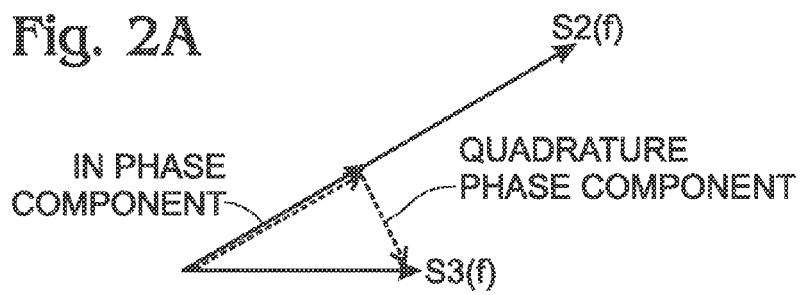
FIGS. 2A and 2B are diagrams depicting the calculation of in-phase and quadrature phase components.
Figure 2B:
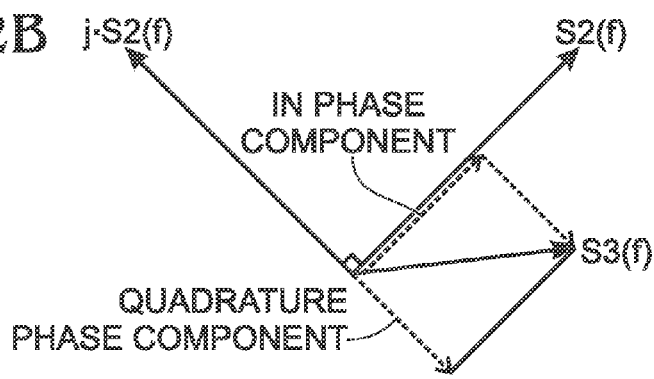

FIGS. 2A and 2B are diagrams depicting the calculation of in-phase and quadrature phase components. Projecting vector S3(f) to vector S2(f) yields the in-phase and quadrature-phase component vectors. The magnitude of the in-phase vector can be calculated with scalar projection, which involves taking a dot product of the two vectors and dividing by the magnitude of S2(f). This division may also be omitted as it is only a scaling factor (i.e. S2(f) is constant). In FIG. 2A the in-phase component is calculated by taking the dot product of S2(f) and S3(f), divided by the absolute value of S2(f). The dot product is real(S2)*real(S3)+imag(S2)*imag(S3). Similarly, to get the quadrature-phase component (FIG. 2B), vector S2(f) is first rotated 90 degrees by multiplying it by the imaginary unit j. Then, the scalar projection is performed as described above.

Figure 3:
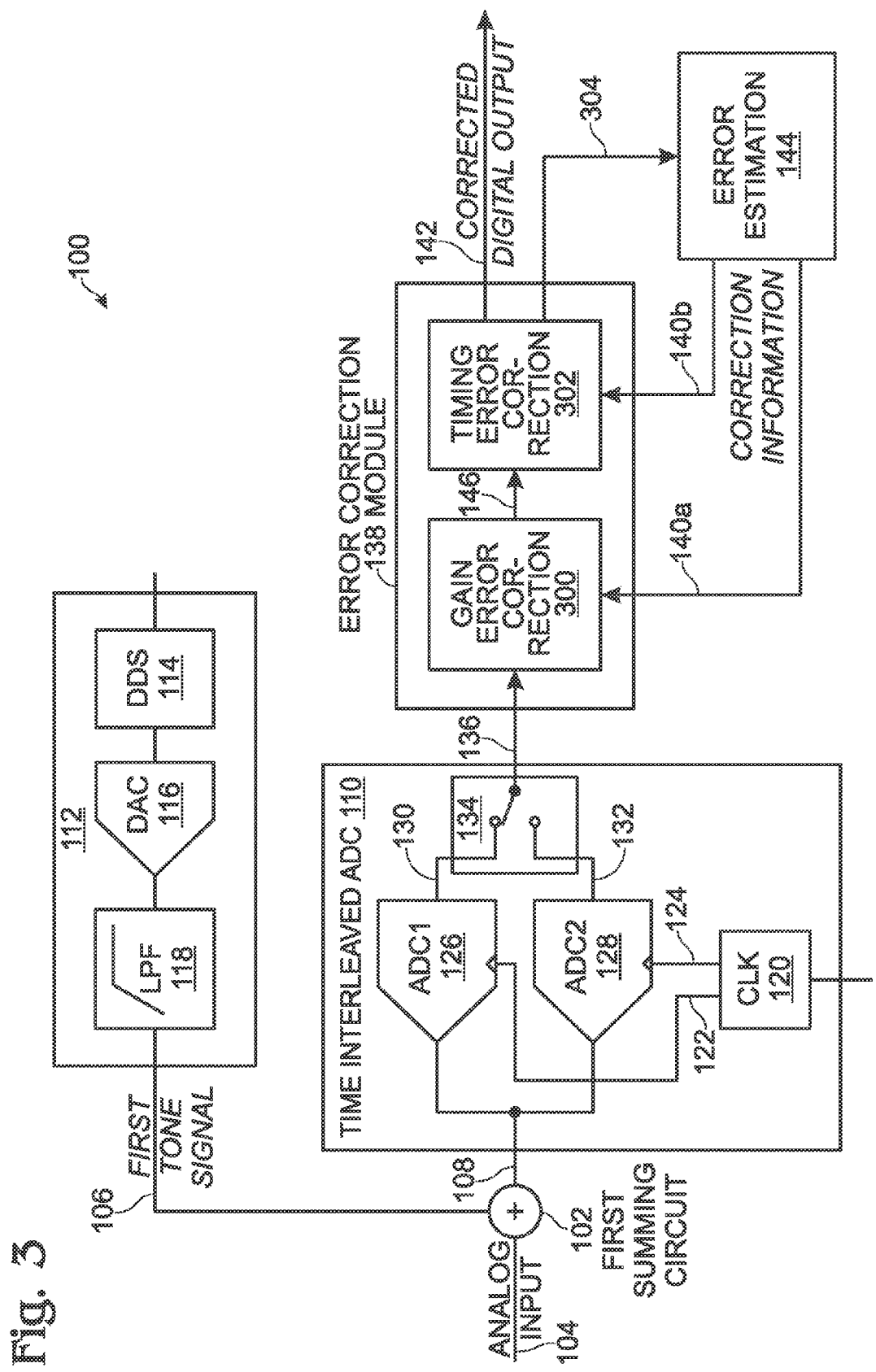
FIG. 3 is a schematic block diagram depicting a first variation of the system of FIG. 1.

FIG. 3 is a schematic block diagram depicting a first variation of the system of FIG. 1. In this aspect, the error correction module 138 comprises a gain error correction module 300 to accept gain error correction information on line 140a, and a timing error correction module 302 to accept timing error correction information on line 140b. The timing error correction module 302 supplies an error estimation signal on line 304, which is closely related to the corrected digital output, as explained in greater detail below.

Figure 4:
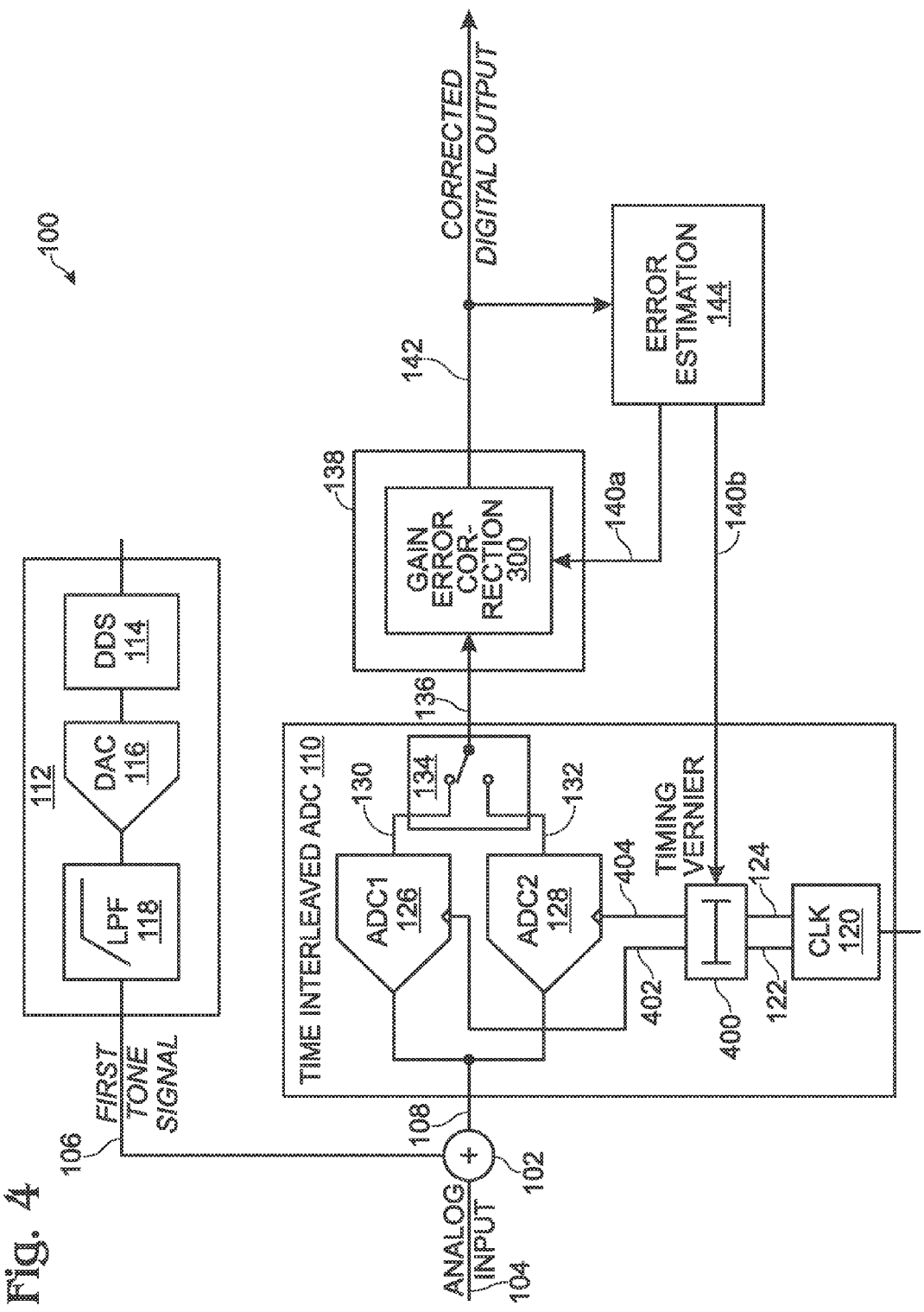
FIG. 4 is a schematic block diagram depicting a second variation of the system of FIG. 1.

FIG. 4 is a schematic block diagram depicting a second variation of the system of FIG. 1. In this aspect, the error correction module 138 comprises a gain error correction module 300 to accept gain error correction information on line 140a. Timing error correction information on line 140b is supplied to timing vernier 400. Timing vernier 400 accepts the clock signal with the two clock phases on lines 122 and 124 from clock 120, and supplies phase adjusted clock signals on lines 402 and 404 in response to the timing error correction information on line 140b.

Figure 5:
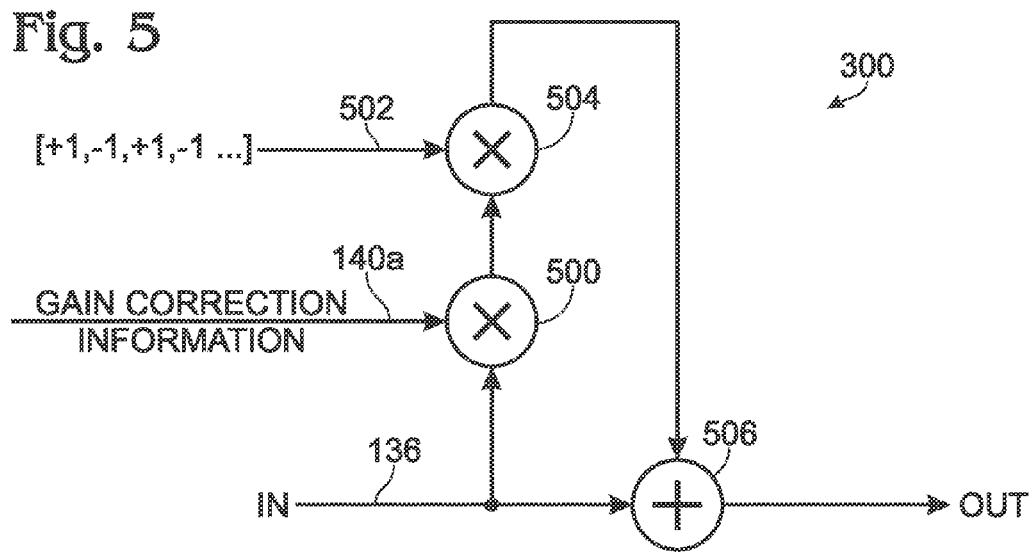
FIG. 5 is a schematic block diagram depicting an exemplary gain error correction module.

FIG. 5 is a schematic block diagram depicting an exemplary gain error correction module. In this example, the interleaved signal (in) on line 136 is multiplied by the gain correction information on line 140a by multiplier 500. The output is multiplied by an interleaving sequence (i.e. +1, −1, +1, −1 . . . ) on line 502 by multiplier 504. This interleaving sequence assigns the correction term to one of the two ADCs (i.e. the positive sign for every other correction value and negative sign for the others). That is, the two ADCs that are interleaved, one having positive errors and the other one negative errors. An ideal ADC would be an average of the two and have zero error. The output multiplier 504 is multiplied by the interleaved signal to supply a corrected digital output, which may be the signal on line 146 of FIG. 3, or the signal on line 142 of FIG. 4.

Figure 6:
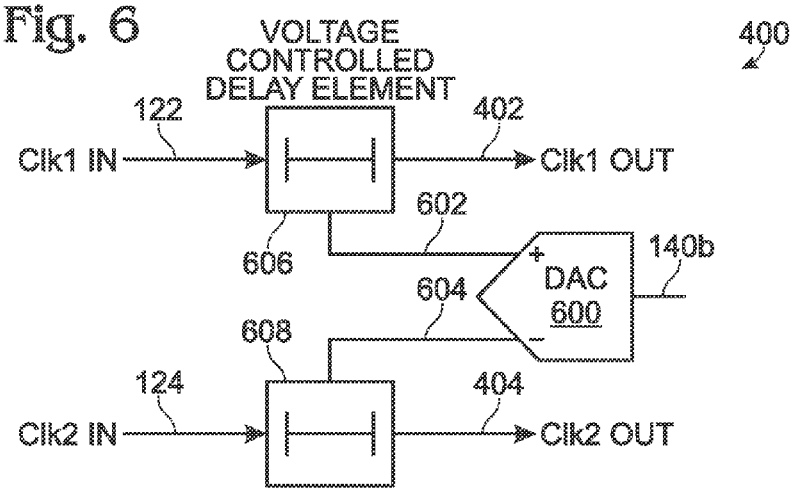
FIG. 6 is a schematic block diagram depicting an exemplary timing vernier of FIG. 4.

FIG. 6 is a schematic block diagram depicting an exemplary timing vernier of FIG. 4. A DAC 600 accepts the timing correction information on line 140b and supplies analog control voltages on lines 602 and 604. Voltage control delay element 606 accepts the clock signal on line 122 and adjusts the phase of the clock signal in response to the control voltage on line 602, to supply the phase adjusted clock signal on line 402. Voltage control delay element 608 accepts the clock signal on line 124 and adjusts the clock phase in response to the control voltage on line 604, to supply the phase adjusted clock signal on line 404. Alternatively but not shown, the delay vernier element can be digitally controlled. Depending on the module in which the DAC is located, the timing correction information on line 140b may be either digital or analog. However, there are other ways of digitally controlled delays that do not include DACs that would be known by one with skill in the art.

Figure 7A:
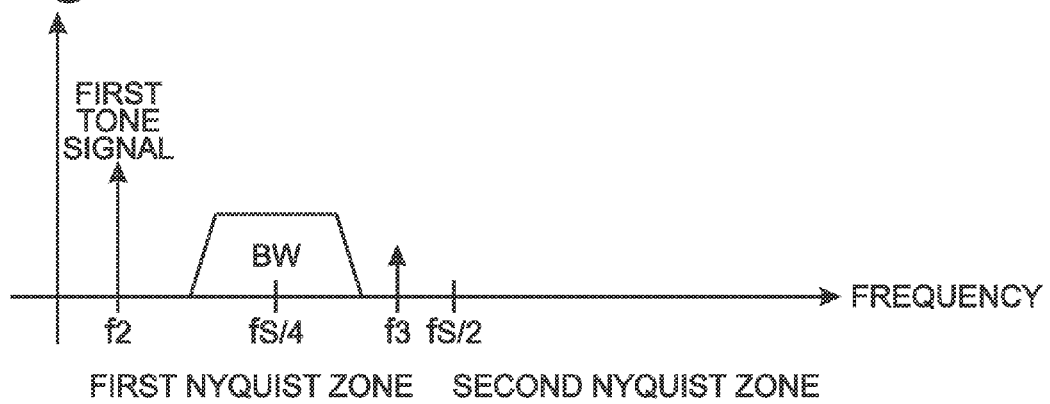
FIG. 7A and 7B are frequency plots depicting the relationship between the frequency of the first tone signal, the analog input bandwidth, and the alias frequency.
Figure 7B:
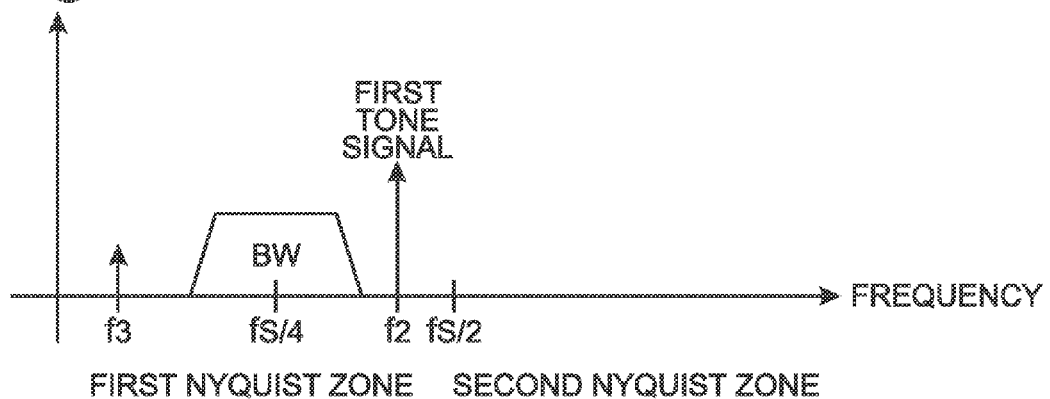

FIG. 7A and 7B are frequency plots depicting the relationship between the frequency of the first tone signal, the analog input bandwidth, and the alias frequency. Generally, the frequency of the first tone signal may be between m(fs/2) and a lower limit of BW in an (m+1)th Nyquist zone (FIG. 2A), or between an upper limit of BW in the (m+1)th Nyquist zone and (m+1)fs/2 (FIG. 2B), where m is an integer greater than or equal to zero. In these examples, m=0.

Figure 8A:
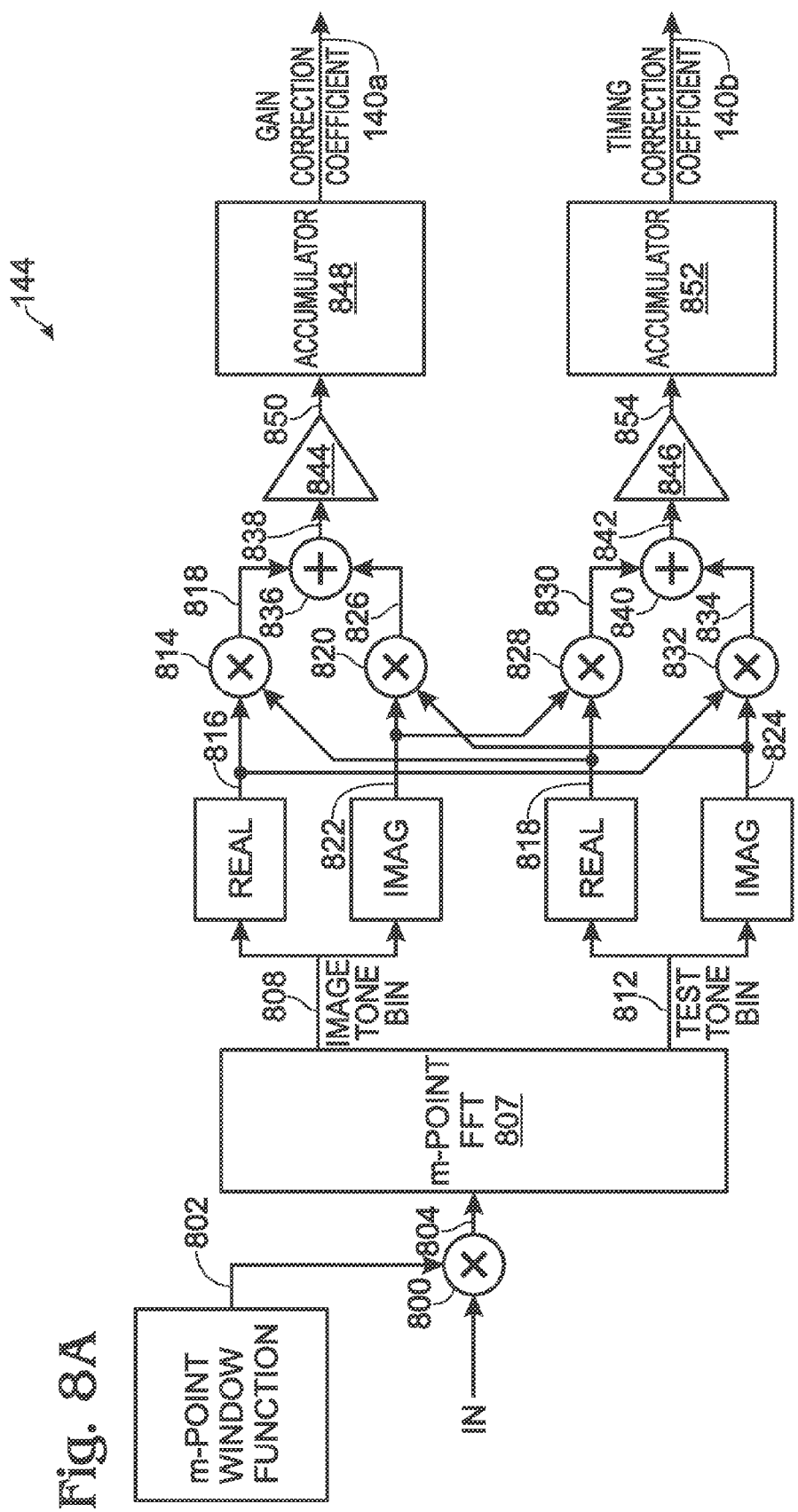
FIGS. 8A and 8B are schematic block diagrams depicting a first variation of the error estimation module.
Figure 8B:
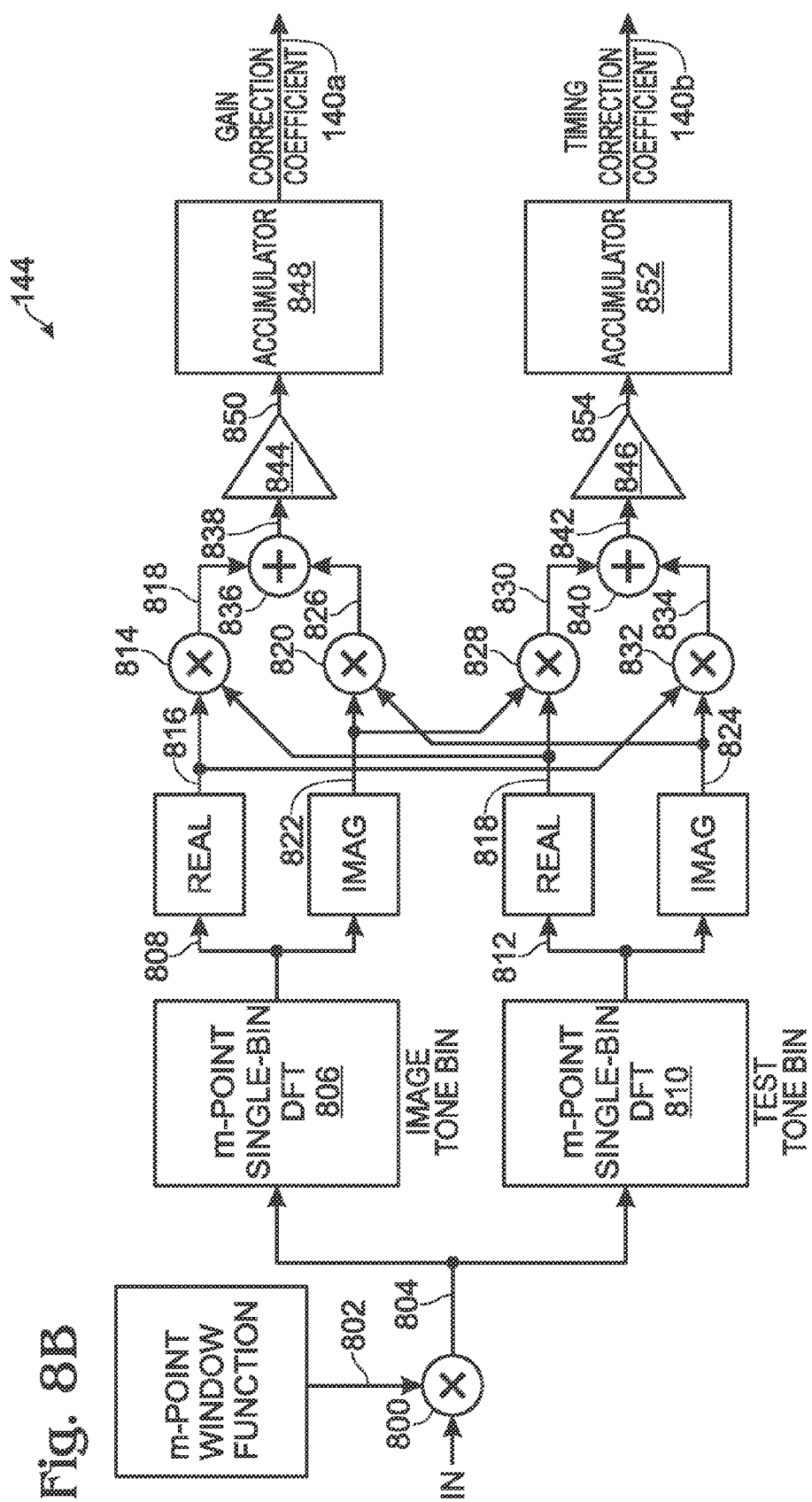

FIGS. 8A and 8B are schematic block diagrams depicting a first variation of the error estimation module. A first multiplier 800 has an input to accept the corrected digital output, as shown in FIG. 4, or the error estimation signal, as shown in FIG. 3. The first multiplier 800 also accepts an m-point window function on line 202, and has an output on line 804 to supply a windowed signal. Here it should be noted that the interleaving ADC (not shown in this figure) supplies an interleaved signal with a sequence of m samples per period (1/fs). The error estimation module 144 further comprises a first time-to-frequency module that may be an m-point fast Fourier transform (FFT) module (807 in FIG. 8A) or a DFT module centered on f3 (806 in FIG. 8B), to supply a first complex value on line 808. A second time-to-frequency module, which may be an m-point FFT module (807 in FIG. 8A) or a DFT module centered on f2 (810 in FIG. 8B), supplies a second complex value on line 812. If modules 806 and 810 are DFT modules, they may perform either a single bin DFT algorithm or FFT function. As is well understood in the art, FFT is the most widely used DFT algorithm but it is not the only one. Its advantage is that when DFT is calculated for multiple frequency bins (m) its complexity grows in proportion to log(m). If only one or handful of frequency bins are needed, as in the systems described herein, FFT is not the most efficient algorithm. For example, the Goertzel algorithm provides a single frequency bin in a manner that is significantly more efficient than FFT.

A third multiplier 814 has inputs on lines 814 and 816 to respectively accept the real parts of the first and second complex values, and an output on line 818 to supply a first product. A fourth multiplier 820 has inputs on lines 822 and 824 to respectively accept the imaginary parts of the first and second complex values, and an output on line 826 to supply a second product. A fifth multiplier 828 has an input on line 818 to accept the real part of the second complex value, an input on line 822 to accept the imaginary part of the first complex value, and an output on line 830 to supply a third product. A sixth multiplier 832 has an input on line 816 to accept the real part of the first complex value, an input on line 824 to accept the imaginary part of the second complex value, and an output on line 834 to supply a fourth product.

A second summing circuit 836 has inputs on lines 818 and 826 to accept the first and second products, and an output on line 838 to supply a first sum. A first subtracting circuit 840 has inputs on lines 830 and 834 for subtracting the fourth product from the third product, and an output on line 842 to supply a first difference. Optionally as shown, the first sum and first difference may be respectively scaled using devices 844 and 846. The gain of the negative feedback loop (i.e. the error estimation module 144) needs to be set somewhere in the system. Here, the gain is set with devices 844 and 846. Alternatively, the gain factor can be built into the subsequent accumulators.

A first accumulator 848 has an input on line 850 to accept the first sum (or scaled first sum) and an output on line 140a to supply gain correction coefficients as a form of gain correction information. A second accumulator 852 has an input on line 854 to accept the first difference (or scaled first difference) and an output on line 140b to supply timing correction coefficients as a form of timing correction information.

Figure 9:
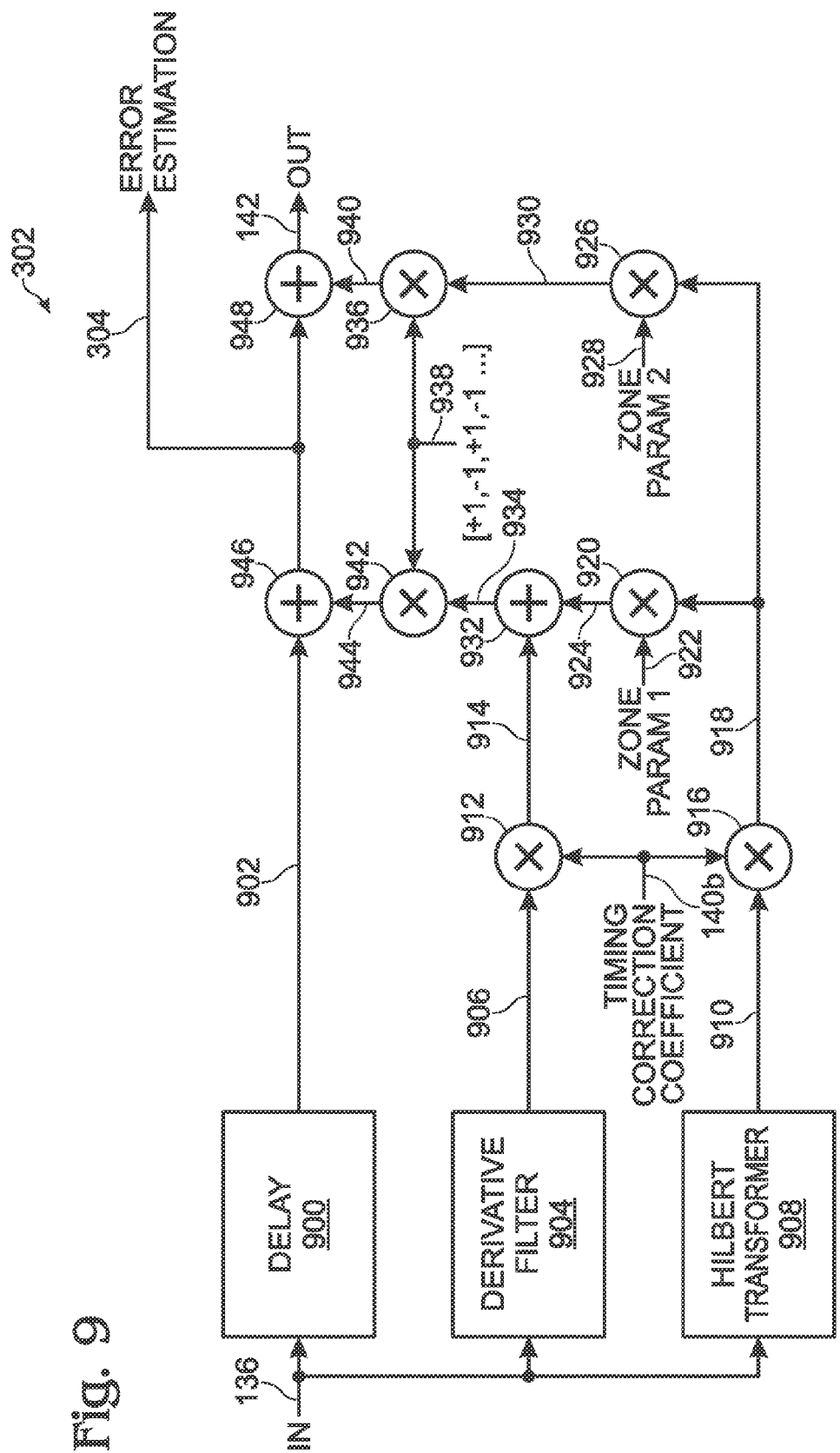
FIG. 9 is a schematic block diagram depicting an exemplary timing error correction module.

FIG. 9 is a schematic block diagram depicting an exemplary timing error correction module. The timing error correction module 302 comprises a delay 900 having an input on line 136 to accept the interleaved signal and an output on line 902 to supply a delayed signal. A derivative module 904 has an input on line 136 to accept the interleaved signal and an output on line 906 to supply a first result. A Hilbert transformation module 908 has an input on line 136 to accept the interleaved signal and an output on line 910 to supply a second result. The delay of module 900 matches the delay through the derivative module 904 and Hilbert transformation module 908, so that when the signals "meet" again, they are aligned in time.

A seventh multiplier 912 has an input on line 906 to accept the first result, an input on line 140b to accept timing correction coefficients, and an output on line 914 to supply a third result. An eighth multiplier 916 has an input on line 910 to accept the second result, an input on line 140b to accept the timing correction coefficients, and an output on line 918 to supply a fourth result. A ninth multiplier 920 has an input on line 918 to accept the fourth result, an input on line 922 to accept Nyquist zone one parameters, and an output to supply a fifth result on line 924. A tenth multiplier 926 has an input on line 918 to accept the fourth result, an input on line 928 to accept Nyquist zone two parameters, and an output on line 930 to supply a sixth result.

Two separate zone parameters may be used if the pilot tone (s2) and the input signal (s1) are in different Nyquist zones. If they are in the same zone, parameter 2 is set to zero. Generally, parameter 1 defines the zone in which the pilot tone is located, and the sum of parameters 1 and 2 is the zone in which the signal is located. The zone parameter values are 0 1 –1 2 –2 . . . for zones 1 2 3 4 5 . . . .

A third summing circuit 932 has an input on line 914 to accept the third result, an input on line 924 to accept the fifth result, and an output on line 934 to supply a seventh result. An eleventh multiplier 936 has an input on line 930 to accept the sixth result, an input on line 938 to accept an interleaving sequence, and an output on line 940 to supply an eighth result. A twelfth multiplier 942 has an input on line 944 to accept the seventh result, an input on line 938 to accept the interleaving sequence, and an output on line 944 to supply a ninth result. A fourth summing circuit 946 has an input on line 944 to accept the ninth result, an input on line 902 to accept the delayed signal, and an output on line 304 to supply the error estimation signal. A fifth summing circuit 948 has an input to accept the error estimation signal on line 304, an input to accept the eighth result on line 940, and an output to supply an timing corrected digital output on line 142.

Figure 10:
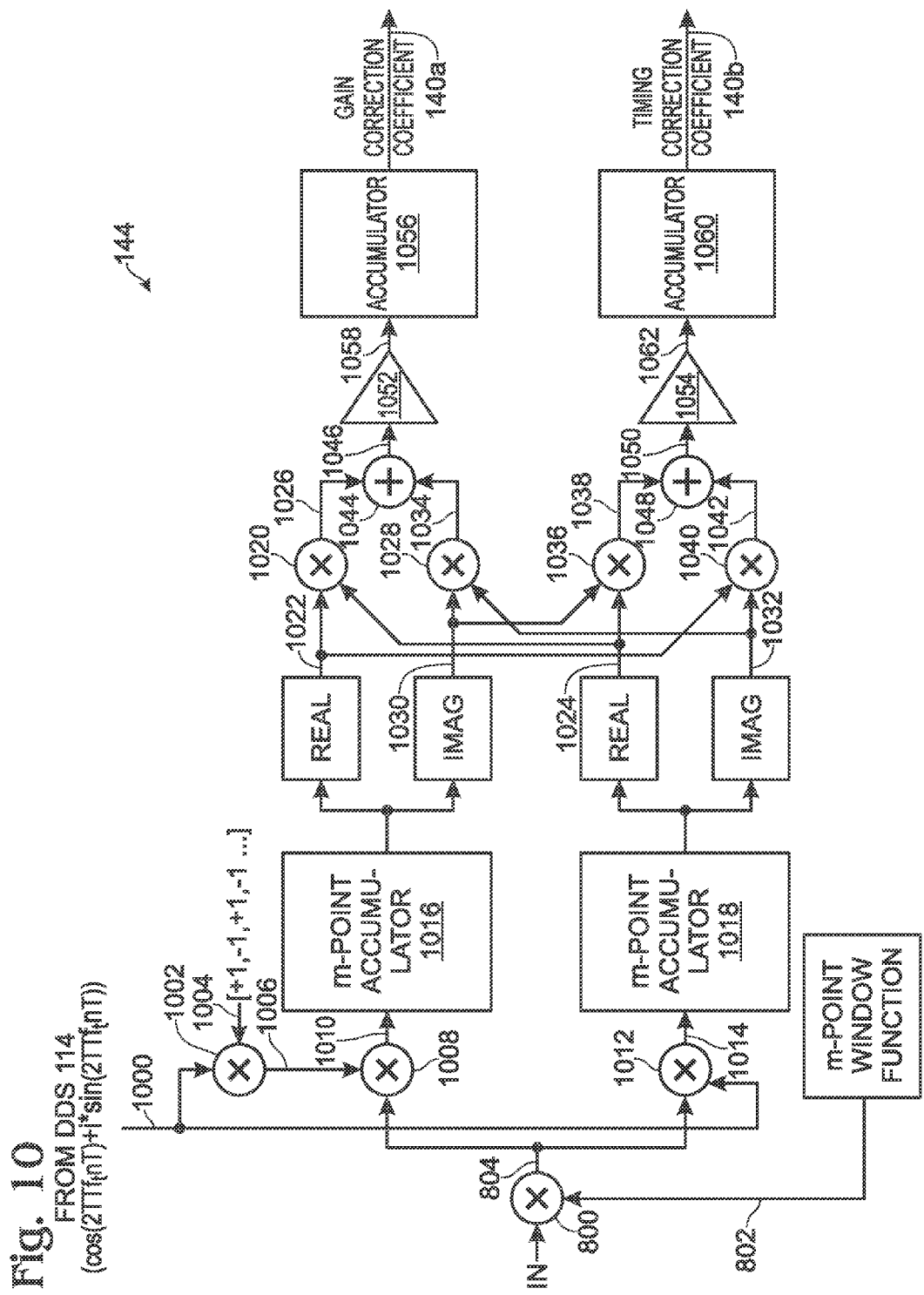
FIG. 10 is a schematic block diagram depicting a second variation of the error estimation module.

FIG. 10 is a schematic block diagram depicting a second variation of the error estimation module. As above, it should be noted that the interleaving ADC (not shown) supplies an interleaved signal with a sequence of m samples per period (1/fs). It should also be noted that the first tone signal on line 1000 has is a digital value with real and orthogonal imaginary components. In this aspect, the error estimation module 144 comprises a thirteenth multiplier 1002 having an input on line 1000 to accept the first tone signal, a periodic function on line 1004 having a frequency of fs/2, and an output on line 1006 to supply a second tone signal at the alias frequency f3=(fs/2−f2).

The first multiplier 800 has an input on line 142 to accept the corrected digital output, as shown in FIG. 4, or the error estimation signal, as shown in FIG. 3. The first multiplier 800 also accepts the m-point window function on line 802, and has an output on line 804 to supply the windowed signal. A fourteenth multiplier 1008 has an input to accept the second tone signal on line 1006, an input on line 804 to accept the windowed signal, and an output on line 1010 to supply a first correlation signal (i.e. performing a time-to-frequency conversion to find the amplitude and phase of the windowed signal at the frequency of the second tone signal). A fifteenth multiplier 1012 has an input on line 1000 to accept the first tone signal, an input on line 804 to accept the windowed signal, and an output on line 1014 to supply a second correlation signal.

A third accumulator 1016 collects m samples of the first correlation signal per period (1/fs). A fourth accumulator 1018 collects m samples of the second correlation signal per period (1/fs). The accumulators are part of the correlation process. Correlation between two signals corresponds to multiplying the signals with one another, sample by sample, and adding together the m multiplied results. The accumulator is doing the addition. The m-point in the accumulator implies that m samples are accumulated, after which the result is passed on and the accumulator is reset to zero to start over again with the next m samples. The components after the accumulators operate at 1/m of the rate of the input signal into the first multiplier 800.

A sixteenth multiplier 1020 has an input to accept real parts of the accumulated first and second correlation signals, respectively, on lines 1022 and 1024, and an output on line 1026 to supply a first product. A seventeenth multiplier 1028 has inputs on lines 1030 and 1032 to accept, respectively, the imaginary parts of the accumulated first and second correlation signals, and an output on line 1034 to supply a second product.

An eighteenth multiplier 1036 has an input on line 1024 to accept the real part of the accumulated second correlation signal, an input on line 1030 to accept the imaginary part of the accumulated first correlated signal, and an output on line 1038 to supply a third product. A nineteenth multiplier 1040 has an input on line 1022 to accept the real part of the accumulated first correlation signal, an input on line 1032 to accept the imaginary part of the accumulated second correlation signal, and an output on line 1042 to supply a fourth product.

A third summing circuit 1044 has inputs on lines 1026 and 1034 to respectively accept the first and second products, and an output on line 1046 to supply a first sum. A second subtracting circuit 1048 has inputs on lines 1036 and 1042 for subtracting the fourth product from the third product, and an output on line 1050 to supply a first difference. Optionally as shown, the first sum and first difference may be respectively scaled using devices 1052 and 1054. A fifth accumulator 1056 has an input on line 1058 to accept the first sum (or a scaled first sum) and an output to supply gain correction coefficients on line 140*a*. A sixth accumulator 1060 has an input on line 1062 to accept the first difference (or a scaled first difference) and an output to supply timing correction coefficients on line 140*b*.

Note: the various components described above in FIGS. 1 through 10 have been described as modules, components, systems, devices, and the like, and may be intended to refer to hardware, firmware, a combination of hardware and software, software enabled as a sequence of microprocessor instructions stored in a non-transitory or computer-readable medium, or software in execution.

Without knowing the ADC input signal, error detection is difficult. One way to facilitate the task is to inject a narrow band known test signal into the ADC input outside the input signal band. In many applications the signal band is centered around fs/4 and leaves some unused bandwidth around DC and around fs/2. In a two path case, if the test signal is, for instance, a tone with frequency f2 and located close to DC, the path mismatch produces an image tone at frequency fs/2−f2 (FIG. 7A). This tone is in the upper out-of-band region and is possible to be detected with sufficient accuracy. Alternatively, the test tone can be located in the upper out-of-band region and then the image tone appears in the lower out-of-band region (FIG. 7B).

A DFT function can be used to detect the tone. Since the frequency of the test tone is exactly known, the value of a single DFT bin can be used to detect its phase and amplitude. In the presence of noise and other unwanted signals this provides much a more accurate method than the high pass filter. This method allows for the detection of a tone of any frequency with just one parameter change (the bin of interest), which can be easily made programmable. The same is not true for the filter.

The DFT can be implemented in several ways, for instance, using the FFT algorithm. However, since there is only one frequency bin of interest, a much more hardware efficient implementation is obtained using a single bin DFT algorithm, such as the Goertzel algorithm. As noted in Wikipedia, the Goertzel algorithm is a digital signal processing (DSP) technique that provides a means for efficient evaluation of individual terms of a DFT. Like the DFT, the Goertzel algorithm analyses one selectable frequency component from a discrete signal. Unlike direct DFT calculations, the Goertzel algorithm applies a single real-valued coefficient at each iteration, using real-valued arithmetic for real-valued input sequences. For covering a full spectrum, the Goertzel algorithm has a higher order of complexity than FFT algorithms. But for computing a small number of selected frequency components, it is more numerically efficient. The simple structure of the Goertzel algorithm makes it well suited to small processors and embedded applications, though it is not limited to these. The Goertzel algorithm can also be used "in reverse" as a sinusoid synthesis function, which requires only 1 multiplication and 1 subtraction per generated sample.

For the DFT based detection to work well in a presence of a wide band input signal, the signal going to the DFT can to be shaped with a window function to prevent excessive spectral leakage from the wide band signal to the image tone frequency. This is accomplished by multiplying it by an m-point window function (the Kaiser window and Blackman are two examples). For an m samples long sequence of signal values, each signal sample is multiplied by the corresponding window function value. For the next m values the same process is repeated, and so on. The window function values can be generated, for instance, by using a lookup table.

Alternatively stated, the DFT is performed on a finite (i.e. m samples) length sequence of signal samples. This process can be viewed as applying (multiplying each input sample by the corresponding window sample) a rectangular window to an infinitely long input sequence. The rectangular window has value 1 from point 0 to point m−1 and value zero elsewhere. So even when the signal is not explicitly windowed, it is in fact windowed with a rectangular window. Multiplication in the time domain is equivalent to convolution in the frequency domain, and as a result, the frequency response of the window function distorts the output of the DFT (as compared to a Fourier transform for an infinitely long signal in continuous time domain). But, by selecting a proper window function, a trade-off can be made between resolution and dynamic range. A rectangular window gives good resolution but poor dynamic range, which means that detecting small signals in the presence of strong signals in other nearby frequencies is difficult. Other window functions such as the Kaiser window, give much wider dynamic range, at the cost of worse frequency resolution.

When the gain error and timing skew are both simultaneously present in the ADC output, the complex valued DFT amplitude is used to maintain orthogonality, which is required to distinguish between these two errors. If only one type of error is present, the power of the DFT bin can be used instead. As shown in FIG. 8B, two DFTs are performed: one for the frequency bin (810) where the test tone is located and another one (806) for the bin into which the image tone falls. The DFT gives a new output value every m samples. This complex value represents the phase and amplitude of the tone at the desired frequency bin.

To obtain the signals representing the gain error and timing error, the image tone is compared to the test tone by using scalar projection (a vector operation). The vector component that is in phase with the test tone represents the gain error and the component 90 degrees out of phase is the timing error. These two components are obtained with four multiply operations between the imaginary and real parts of the DFT outputs, and two subsequent summing operations of the multiplier outputs as shown in FIGS. 8A, 8B, and 10. The comparison of in-phase and quadrature phase components is also depicted in FIGS. 2A and 2B.

Next the outputs of the adders are scaled and accumulated. The outputs of the accumulators are the correction coefficients that are fed back to the gain error and timing error correction modules. Once activated, these negative feedback loops converge to values that cancel the gain and timing errors.

The purpose of the scaling before the accumulator is to control the speed and stability of the feedback loop. Alternatively but not shown, the scaling can be performed at the output of the accumulator. The scaling can be made programmable. The accumulation is needed to provide nearly infinite loop gain at low frequencies, which is useful for driving the errors to zero. The accumulation also provides filtering for any noise present in the error detection.

The gain error correction module and timing error correction module are independent of each other. The use of two different zone parameters permits the test tone and the input signal to be in different Nyquist zones. Besides the use of a filter, as used in the prior art correction methods, correlation is another method of detecting a tone, as described in FIG. 10. Since the DFT function can be understood as a correlation with a sinusoid, both methods are similar.

Figure 11A:
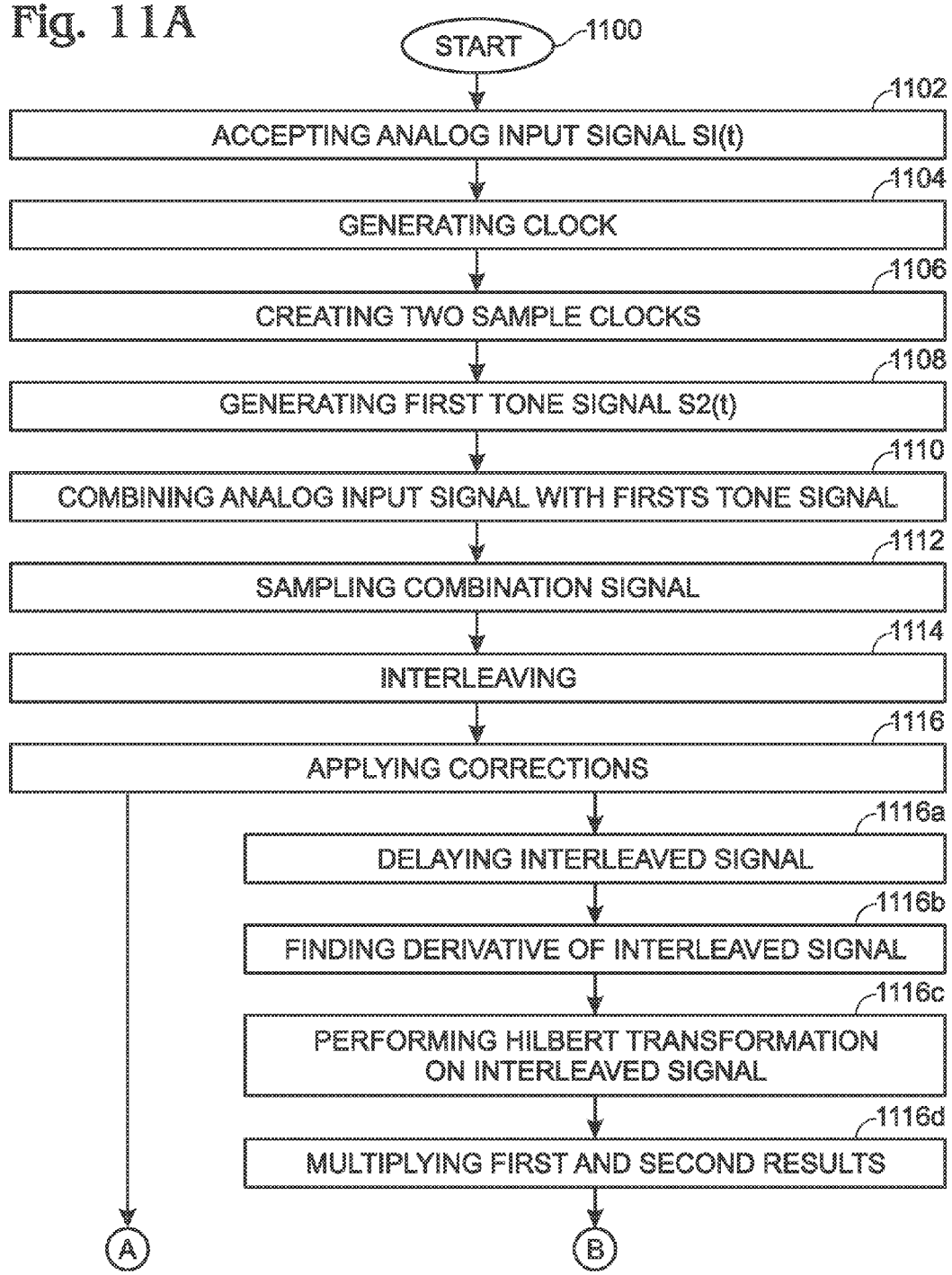
FIGS. 11A through 11C are flowcharts illustrating a method of performing background corrections for an interleaving ADC.
Figure 11B:
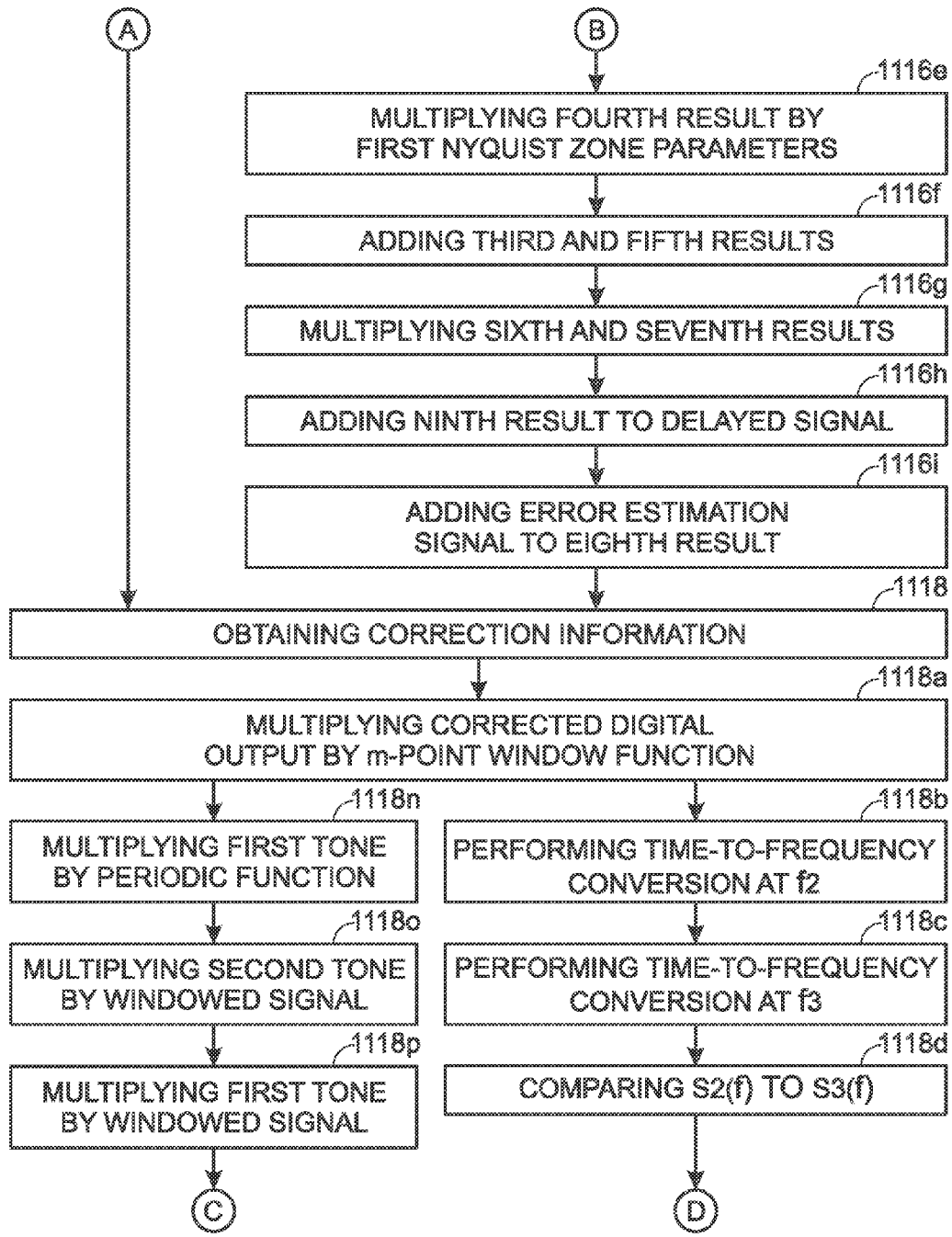
Figure 11C:
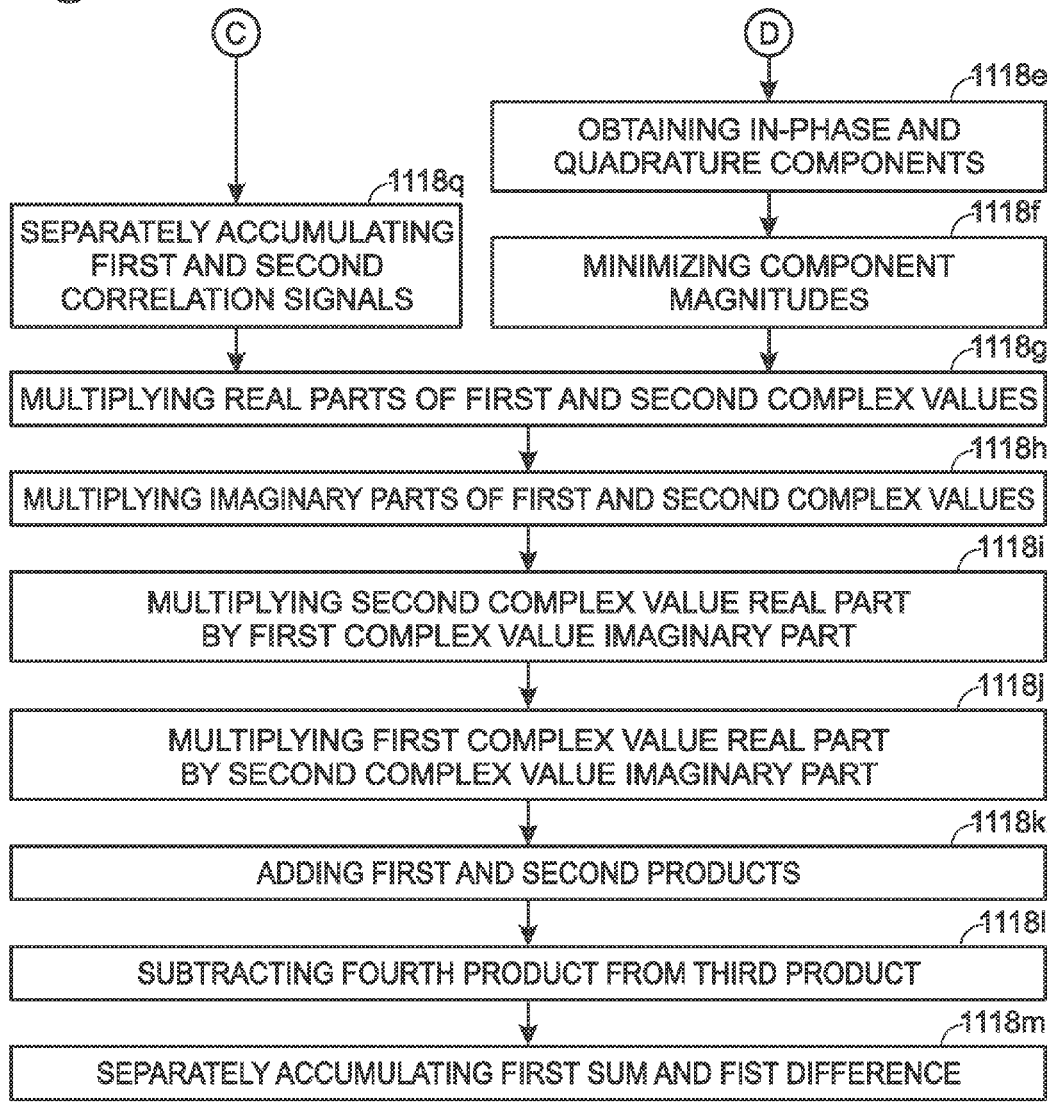

FIGS. 11A through 11C are flowcharts illustrating a method of performing background corrections for an interleaving ADC. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps, and the details of the method are supported by the explanations of FIGS. 1 through 10. The method starts at Step 1100.

Step 1102 accepts an analog input signal s1($t$) having a first frequency f1 and a bandwidth (BW). Step 1104 generates a clock having a clock frequency fs. In one aspect, the second frequency is between m(fs/2) and a lower limit of BW in an (m+1)th Nyquist zone, or between an upper limit of BW in the (m+1)th Nyquist zone and (m+1)fs/2, where m is an integer greater than or equal to zero. Step 1106 creates 2 sample clocks with evenly spaced phases, each having a sample clock frequency of fs/2. Step 1108 generates a first tone signal s2($t$) having a predetermined second frequency f2 outside BW. Step 1110 combines the analog input signal and the first tone signal, creating a combination signal. Step 1112 samples the combination signal using the sample clocks, creating 2 digital sample signals per clock period 1/fs. Step 1114 interleaves the 2 digital sample signals, creating an interleaved signal. Step 1116 applies corrections that minimize errors in the interleaved signal to obtain a corrected digital output. For example, Step 1116 may adjust digital sample signal amplitudes, adjust sample clock phases, adjust the digital sample signal phases, or combinations or the above-mentioned adjustments.

More explicitly, applying the timing error corrections in Step 1116 may include the following substeps. Step 1116$a$ delays the interleaved signal to obtain a delayed signal. Step 1116$b$ finds a derivative of the interleaved signal to supply a first result. Step 1116$c$ performs a Hilbert transformation on the interleaved signal to supply a second result. Step 1116$d$ multiplies the first result and the second result by a timing correction coefficient to respectively obtain a third result and a fourth result. Step 1116$e$ multiplies the fourth result by Nyquist zone one parameters and Nyquist zone two parameters to respectively obtain a fifth result and a sixth result. Step 1116$f$ adds the third result to the fifth result to obtain a seventh result. Step 1116$g$ multiplies the sixth and seventh results by an interleaving sequence to respectively obtain an eighth result and a ninth result. Step 1116$h$ adds the ninth result with the delayed signal to obtain an error estimation signal. Step 1116$i$ adds the error estimation signal to eighth result to obtain a timing corrected digital output.

Step 1118 determines errors at an alias frequency f3, associated with the second frequency f2, to obtain correction information. In one aspect, creating the interleaved signal in Step 1110 includes creating an interleaved signal including a sequence of m samples per period (1/fs). Then, obtaining the correction information in Step 1118 comprises the following substeps. Step 1118$a$ multiplies the corrected digital output by an m-point window function to obtain a windowed signal. Step 1118$b$ performs a time-to-frequency conversion at the second frequency f2, creating a S2($f$) signal in the frequency domain. Step 1118$c$ performs a time-to-frequency conversion for an alias signal s3($t$), at frequency f3, creating a S3($f$) signal in the frequency domain. For example, Steps 1118$b$ and 1118$c$ may perform discrete Fourier transforms (DFTs). More explicitly, Steps 1118$b$ and 1118$c$ may respectively perform either m-point fast Fourier transforms (FFTs) of the windowed signal or independent DFT functions on the windowed signal, at a frequency centered on f2 and a frequency centered on f3, respectively creating first and second complex values. If DFT functions are performed, they may be either a single bin DFT algorithm or a FFT. Step 1118$d$ compares the S2($f$) signal to the S3($f$) signal. Step 1118$e$ obtains a first in-phase component magnitude and a second quadrature-phase component magnitude. Step 1118$f$ minimizes the magnitude of the first component, the second component, or both the first and second components.

Step 1118$g$ multiplies real parts of the first and second complex values to obtain a first product. Step 1118$h$ multiplies imaginary parts of the first and second complex values to obtain a second product. Step 1118$i$ multiplies the real part of the second complex value by the imaginary part of the first complex value to obtain a third product. Step 1118$j$ multiplies the real part of the first complex value by the imaginary part of the second complex value to obtain a fourth product. Step 1118$k$ adds the first and second products to obtain a first sum. Step 1118$l$ subtracts the fourth product from the third product to obtain a first difference. Step 1118$m$ separately accumulates the first sum and the first difference to respectively obtain gain and timing correction coefficients.

Alternatively, obtaining the correction information of Step 1118 may be obtained using the following substeps. Again, it is assumed that Step 1110 creates an interleaved signal including a sequence of m samples per period (1/fs). As above, Step 1118a multiplies the corrected digital output by an m-point window function to obtain a windowed signal. Then, Step 1118n multiplies the first tone signal by a periodic function having a frequency of fs/2 to obtain a second tone signal at the alias frequency f3=(fs/2−f2). Step 1118o multiplies the second tone signal by the windowed signal to obtain a first correlation signal. Step 1118p multiplies the first tone signal, represented as a digital value with real and orthogonal imaginary components, by the windowed signal to obtain a second correlation signal. Step 1118q separately accumulates m samples of the first and second correlation signals per period (1/fs), the output of which may be referred to as first and second complex values or accumulated first and second correlation signals. Subsequent to Step 1118q, Steps 1118g through 1118m are performed, as described above.

A system and method have been provided for performing background corrections in an interleaving analog-to-digital converter ADC. Examples of particular message structures, processes, and modules have been presented to illustrate the invention. However, the invention is not limited to merely these examples. Other variations and embodiments of the invention will occur to those skilled in the art.

I claim:

1. A method of performing background corrections for an interleaving analog-to-digital converter (ADC), the method comprising:
    accepting an analog input signal s1($t$) having a first frequency f1 and a bandwidth (BW);
    generating a clock having a clock frequency fs;
    creating 2 sample clocks with evenly spaced phases, each having a sample clock frequency of fs/2;
    generating a first tone signal s2($t$) having a predetermined second frequency f2 outside BW;
    combining the analog input signal and the first tone signal, creating a combination signal;
    sampling the combination signal using the sample clocks, creating 2 digital sample signals per clock period 1/fs;
    interleaving the 2 digital sample signals, creating an interleaved signal;
    applying corrections that minimize errors in the interleaved signal to obtain a corrected digital output; and,
    determining errors at an alias frequency f3, associated with the second frequency f2, to obtain correction information.

2. The method of claim 1 wherein determining errors at the alias frequency to obtain correction information comprises:
    performing a time-to-frequency conversion at the second frequency f2, creating a S2($f$) signal in the frequency domain;
    performing a time-to-frequency conversion for an alias signal s3($t$), at frequency f3, creating a S3($f$) signal in the frequency domain; and,
    comparing the S2($f$) signal to the S3($f$) signal;
    obtaining a first in-phase component magnitude and a second quadrature-phase component magnitude; and,
    minimizing a magnitude selected from a group consisting of the first component, the second component, and both the first and second components.

3. The method of claim 2 wherein performing the time-to-frequency conversion at frequencies f2 and f3 includes performing discrete Fourier transforms (DFTs).

4. The method of claim 2 wherein creating the interleaved signal includes creating an interleaved signal including a sequence of m samples per period (1/fs);
    wherein determining errors at the alias frequency to obtain correction information comprises multiplying the corrected digital output by an m-point window function to obtain a windowed signal;
    wherein performing the time-to-frequency conversion at the second frequency f2 and for the alias signal s3($t$) includes:
        performing an operation selected from a group consisting of a) an m-point fast Fourier transform (FFT) of the windowed signal and b) independent DFT functions on the windowed signal, respectively, at a frequency centered on f2 and a frequency centered on f3; and,
        respectively creating first and second complex values.

5. The method of claim 4 wherein performing the DFT functions includes performing a function selected from a group consisting of a single bin DFT algorithm and a FFT.

6. The method of claim 4 wherein determining errors at the alias frequency to obtain correction information comprises:
    multiplying real parts of the first and second complex values to obtain a first product;
    multiplying imaginary parts of the first and second complex values to obtain a second product;
    multiplying the real part of the second complex value by the imaginary part of the first complex value to obtain a third product;
    multiplying the real part of the first complex value by the imaginary part of the second complex value to obtain a fourth product;
    adding the first and second products to obtain a first sum;
    subtracting the fourth product from the third product to obtain a first difference; and,
    separately accumulating the first sum and the first difference to respectively obtain gain and timing correction coefficients.

7. The method of claim 1 wherein applying corrections includes applying corrections selected from a group consisting of adjusting digital sample signal amplitudes, adjusting sample clock phases, adjusting the digital sample signal phases, and combinations or the above-mentioned adjustments.

8. The method of claim 1 wherein generating the first tone signal includes generating the first tone signal at a second frequency selected from a group consisting of a second frequency between m(fs/2) and a lower limit of BW in an (m+1)th Nyquist zone, and a second frequency between an upper limit of BW in the (m+1)th Nyquist zone and (m+1)fs/2, where m is an integer greater than or equal to zero.

9. The method of claim 1 wherein applying the corrections includes applying timing corrections as follows:
    delaying the interleaved signal to obtain a delayed signal;
    finding a derivative of the interleaved signal to supply a first result;
    performing a Hilbert transformation on the interleaved signal to supply a second result;
    multiplying the first result and the second result by a timing correction coefficient to respectively obtain a third result and a fourth result;
    multiplying the fourth result by Nyquist zone one parameters and Nyquist zone two parameters to respectively obtain a fifth result and a sixth result;
    adding the third result to the fifth result to obtain a seventh result;

multiplying the sixth and seventh results by an interleaving sequence to respectively obtain an eighth result and a ninth result;

adding the ninth result with the delayed signal to obtain an error estimation signal; and, adding the an error estimation signal to eighth result to obtain a timing corrected digital output.

10. The method of claim 1 wherein creating the interleaved signal includes creating an interleaved signal including a sequence of m samples per period (1/fs);

wherein determining errors at the alias frequency to obtain correction information comprises:

multiplying the first tone signal by a periodic function having a frequency of fs/2 to obtain a second tone signal at the alias frequency f3=(fs/2−f2);

multiplying the corrected digital output by an m-point window function to obtain a windowed signal;

multiplying the second tone signal by the windowed signal to obtain a first correlation signal;

multiplying the first tone signal, represented as a digital value with real and orthogonal imaginary components, by the windowed signal to obtain a second correlation signal;

separately accumulating m samples of the first and second correlation signals per period (1/fs);

multiplying real parts of the accumulated first and second correlation signals to obtain a first product;

multiplying imaginary parts of the accumulated first and second correlation signals to obtain a second product;

multiplying the real part of the accumulated second correlation signal by the imaginary part of the accumulated first correlation signal to obtain a third product;

multiplying the real part of the accumulated first correlation signal by the imaginary part of the accumulated second correlation signal to obtain a fourth product;

adding the first and second products to obtain a first sum;

subtracting the fourth product from the third product to obtain a first difference; and, separately accumulating the first sum and the first difference to respectively obtain gain and timing correction coefficients.

11. A system performing background corrections for an interleaving analog-to-digital converter (ADC), the system comprising:

a first summing circuit having inputs to accept an analog input signal s1(t) with a first frequency f1 and a bandwidth (BW), and a first tone signal s2(t) having a predetermined second frequency f2 outside BW, and an output to supply a combination signal;

a clock having a clock frequency fs, with outputs to supply 2 sample clocks with evenly spaced phases, each having a sample clock frequency of fs/2;

an interleaving ADC having inputs to accept the combination signal and the two sample clocks, and an output to supply an interleaved signal;

an error correction module having an input to accept the interleaved signal and an input to accept correction information, the error correction module applying corrections that minimize errors in the interleaved signal, and supplying a corrected digital output; and, an error estimation module having an input to accept the corrected digital output, the error estimation module determining errors at an alias frequency f3, associated with the second frequency f2, to supply the correction information at an output.

12. The system of claim 11 wherein the error estimation module performs a time-to-frequency conversion at the second frequency f2 and the third frequency f3, respectively creating S2(f) and S3(f) signals in the frequency domain, compares the S2(f) signal to the S3(f) signal, obtains obtaining a first in-phase component magnitude and a second quadrature-phase component magnitude, and supplies correction information to minimize a magnitude selected from a group consisting of the first component, the second component, and both the first and second components.

13. The system of claim 12 wherein the error estimation module performs discrete Fourier transforms (DFTs) at frequencies f2 and f3.

14. The system of claim 12 wherein the interleaving ADC supplies an interleaved signal with a sequence of m samples per period (1/fs);

wherein the error estimation module comprises:

a first multiplier having inputs to accept the corrected digital output and an m-point window function, and an output to supply a windowed signal;

a first time-to-frequency module selected from a group consisting of an m-point fast Fourier transform (FFT) module and a DFT module centered on f3 to supply a first complex value; and, a second time-to-frequency module selected from a group consisting of an m-point FFT module and a DFT module centered on f2 to supply a second complex value.

15. The system of claim 14 wherein the DFT module performs a function selected from a group consisting of a single bin DFT algorithm and a FFT.

16. The system of claim 14 wherein the error estimation module further comprises:

a third multiplier having inputs to accept real parts of the first and second complex values, and an output to supply a first product;

a fourth multiplier having inputs to accept imaginary parts of the first and second complex values, and an output to supply a second product;

a fifth multiplier having inputs to accept the real part of the second complex value and the imaginary part of the first complex value, and an output to supply a third product;

a sixth multiplier having inputs to accept the real part of the first complex value and the imaginary part of the second complex value, and an output to supply a fourth product;

a second summing circuit having inputs to accept the first and second products, and an output to supply a first sum;

a first subtracting circuit having inputs for subtracting the fourth product from the third product, and an output to supply a first difference;

a first accumulator having an input to accept the first sum and an output to supply gain correction coefficients; and, a second accumulator having an input to accept the first difference and an output to supply timing correction coefficients.

17. The system of claim 12 wherein the interleaving ADC supplies an interleaved signal with a sequence of m samples per period (1/fs);

wherein the first summing circuit accepts the first tone signal having real and orthogonal imaginary components;

wherein the error estimation module comprises:

a thirteenth multiplier having inputs to accept the first tone signal and a periodic function having a frequency of fs/2, and an output to supply a second tone signal at the alias frequency f3=(fs/2−f2);

a first multiplier having inputs to accept the corrected digital output and an m-point window function, and an output to supply a windowed signal;

a fourteenth multiplier having inputs to accept the second tone signal and the windowed signal, and an output to supply a first correlation signal;

a fifteenth multiplier having inputs to accept the first tone signal, represented as a digital value with real and orthogonal imaginary components, and the windowed signal, and an output to supply a second correlation signal;

a third accumulator to collect m samples of the first correlation signal per period (1/fs);

a fourth accumulator to collect m samples of the second correlation signal per period (1/fs);

a sixteenth multiplier having inputs to accept real parts of the accumulated first and second correlation signals, and an output to supply a first product;

a seventeenth multiplier having inputs to accept imaginary parts of the accumulated first and second correlation signals, and an output to supply a second product;

an eighteenth multiplier having inputs to accept the real part of the accumulated second correlation signal and the imaginary part of the accumulated first correlated signal, and an output to supply a third product;

a nineteenth multiplier having inputs to accept the real part of the accumulated first correlation signal and the imaginary part of the accumulated second correlation signal, and an output to supply a fourth product;

a third summing circuit having inputs to accept the first and second products, and an output to supply a first sum;

a second subtracting circuit having inputs for subtracting the fourth product from the third product, and an output to supply a first difference;

a fifth accumulator having an input to accept the first sum and an output to supply gain correction coefficients; and, a sixth accumulator having an input to accept the first difference and an output to supply timing correction coefficients.

18. The system of claim 11 wherein the error correction module supplies correction information selected from a group consisting of adjusting digital sample signal amplitudes, adjusting sample clock phases, adjusting the digital sample signal phases, and combinations or the above-mentioned adjustments.

19. The system of claim 11 wherein the first summing circuit accepts the first tone signal at a second frequency selected from a group consisting of a second frequency between m(fs/2) and a lower limit of BW in an (m+1)th Nyquist zone, and a second frequency between an upper limit of BW in the (m+1)th Nyquist zone and (m+1)fs/2, where m is an integer greater than or equal to zero.

20. The system of claim 11 wherein the error correction module comprises a timing error correction module, the timing corrections module further comprising:

a delay having an input to accept the interleaved signal and an output to supply a delayed signal;

a derivative module having an input to accept the interleaved signal and an output to supply a first result;

a Hilbert transformation module having an input to accept the interleaved signal and an output to supply a second result;

a seventh multiplier having inputs to accept the first result and a timing correction coefficient, and an output to supply a third result;

an eighth multiplier having inputs to accept the second result and the timing correction coefficient, and an output to supply a fourth result;

a ninth multiplier having inputs to accept the fourth result and Nyquist zone one parameters, and an output to supply a fifth result;

a tenth multiplier having inputs to accept the fourth result and Nyquist zone two parameters, and an output to supply a sixth result;

a third summing circuit having inputs to accept the third result and the fifth result, and an output to supply a seventh result;

an eleventh multiplier having inputs to accept the sixth result and an interleaving sequence, and an output to supply an eighth result;

a twelfth multiplier having inputs to accept the seventh result and the interleaving sequence, and an output to supply a ninth result;

a fourth summing circuit having inputs to accept the ninth result and the delayed signal, and an output to supply an error estimation signal; and, a fifth summing circuit having inputs to accept the error estimation signal and the eighth result, and an output to supply a timing corrected digital output.

* * * * *